United States Patent [19]

Ueda et al.

[11] 4,352,172
[45] Sep. 28, 1982

[54] DETECTION DEVICE OF ELECTRONIC TIMEPIECE

[75] Inventors: Makoto Ueda; Akira Torisawa; Shuji Otawa; Masaaki Mandai; Masaharu Shida; Katsuhiko Sato, all of Tokyo, Japan

[73] Assignee: Kabushiki Kaisha Daini Seikosha, Tokyo, Japan

[21] Appl. No.: 144,662

[22] Filed: Apr. 28, 1980

[30] Foreign Application Priority Data

May 4, 1979 [JP] Japan ................................ 54-54862

[51] Int. Cl.³ .................... G05B 19/40; G04B 19/00; G04F 5/00
[52] U.S. Cl. ..................................... 368/76; 368/157; 318/696
[58] Field of Search .................. 368/76, 80, 155-157, 368/160, 85-87, 217-219; 318/696

[56] References Cited

U.S. PATENT DOCUMENTS 4,157,647  6/1979  Takahash et al. .................. 368/159
4,209,971  7/1980  Ueda et al. ........................... 368/76

*Primary Examiner*—Vit W. Miska
*Attorney, Agent, or Firm*—Robert E. Burns; Emmanuel J. Lobato; Bruce L. Adams

[57] ABSTRACT

An electronic timepiece has a stepping motor comprised of a stator, rotor and coil, and circuitry for producing and applying driving pulses to the coil to effect stepwise rotation of the rotor. The presence of an external alternating magnetic field is detected by switching the coil from an open-circuit condition to a low impedance loop comprised of the coil and a low impedance element. The rotation of the rotor is detected by alternately switching the coil between the low impedance loop and a high impedance loop comprised of the coil and a high impedance element. Control circuitry controls the switching operations to ensure that the magnetic field detection and the rotor rotation detection are carried out at different times.

12 Claims, 24 Drawing Figures

DETECTION DEVICE OF ELECTRONIC TIMEPIECE

BACKGROUND OF THE INVENTION

The present invention relates to a detection device of an electronic timepiece which drives a stepping motor with low power consumption constantly even if the timepiece is subjected to an external alternating magnetic field.

In order to drive a timepiece stepping motor with less power consumption, such as an ultra micro stepping motor of an electronic wristwatch, the so-called correction driving method has been proposed. The correction driving method is a method for driving a motor with a low power consumption when the stepping motor drives normally, and for driving the motor with more power consumption than usual when the motor rotor does not rotate normally for some reason or other, without delay.

When using the correction driving method, it is important to detect rotation and non-rotation of the rotor and to assure the rotation of the rotor against adverse external conditions, such as magnetic fields in comparison with the conventional fixed pulse driving method.

FIG. 1(A) shows an embodiment of a bipolar stepping motor used in the conventional electronic watch for driving the hands and which can be used as well in the present invention, and FIG. 1(B) shows an embodiment of alternate polarity driving pulses conventionally used for driving the stepping motor of this structure.

By applying the driving pulses of alternate polarity as shown in FIG. 1(B) to a coil 3, a stator 1 is magnetized and a rotor 2 is rotated stepwise at 180° C. increments by repulsion and attraction of the stator 1 and the magnetic poles of the rotor 2.

The length (pulse width) of the driving pulses applied to the coil has been determined at the width to assure the rotation of the motor under any conditions of a watch. In order to assure the rotation of the motor, it is necessary to make the pulse width longer than that normally needed to drive the motor under normal load conditions so that sufficient power is available to drive the motor under greater load conditions, such as for operating a calendar mechanism, when there is an increase in the internal resistance of a battery, when there is a reduction in the battery voltage at the end of the battery life, and the like.

Accordingly, the following driving method of the stepping motor has been proposed. Namely, the stepping motor is driven by a pulse having a short pulse width which produces a small torque normally sufficient to drive the motor, and when the stepping motor temporarily stops rotating due to a heavy load, the stepping motor is driven again by a pulse having a longer pulse width which produces a sufficiently large torque to drive the motor even under the heavy load condition. However, it is difficult to provide particular detection elements, such as a mechanical contact, a Hall effect element and the like, for detecting rotation and non-rotation of the rotor since a reduction in overall watch size and a low cost are required.

Accordingly, the rotation and non-rotation of the rotor is detected taking advantage of the feature that there exists a difference in voltages induced by the oscillation of the rotor between the rotor being rotated and not rotated, after the driving pulse is applied.

FIG. 2 shows a driver detection circuit of the stepping motor according to the conventional type and the present invention. In the circuit, inputs of N channel FET gates (referred to as an N gate hereafter) 4b, 5b and inputs of P channel FET gates (referred to as a P gate hereafter) 4a, 5a are respectively separated and the N gates 4b, 5b and the P gates 4a, 5a are simultaneously OFF. The circuit comprises detection resistors 6a, 6b for detecting rotation and nonrotation of the rotor 2 and N gates 7a, 7b for switching on the detection resistors.

FIG. 3 shows a time chart of the conventional correction driving method. When a voltage is applied across the coil, a current flows in the coil through a current passage 9 in FIG. 2 during a time interval "a" in FIG. 3. Subsequently, during a time interval "b" in FIG. 3, the circuit is switched to a closed loop 10 including the detection resistor 6b in FIG. 2. At this time the voltage induced by the oscillation of the rotor 2 appears at a terminal 8b after the driving pulse is applied. If a non-rotation signal is detected during the time interval "b", the stepping motor is driven correctly by a driving pulse of sufficiently long pulse width to cause current to again flow in the current passage 9 in FIG. 2 so as to satisfy the specification of the watch during a time interval "c" in FIG. 3.

Referring next to the detection principle of rotation and non-rotation of the rotor, FIG. 4 shows current waveforms when the current is flowing in the coil 3 of the stepping motor whose coil resistance is 3 K$\Omega$ and number of turns is 10000 turns. The current waveform during the time interval "a" is due to the driving pulse of 3.9 msec pulse width and shows almost the same waveforms regardless of rotation and non-rotation of the rotor. The current waveforms during the time interval "b" are pulses induced by the vibration or oscillation of the rotor 2 after the driving pulse is applied, varying in a large scale under the conditions of the rotor, i.e., whether the rotor rotates or not and whether a load is connected to the motor or not. The waveform b1 during the time interval "b" in FIG. 4 shows the current waveform in case the rotor 2 rotates and the waveform b2 shows the current waveform in case the rotor 2 does not rotate. The drives detection circuit in FIG. 2 has been invented to extract the difference in currents between the rotor being rotated and not rotated in the form of a voltage waveform. The circuit is switched to the closed loop 10 during the time interval "b" in FIG. 4, whereby the current induced by oscillation or vibration of the rotor 2 flows in the direction resistor 6b and a larger voltage waveform appears at the terminal 8b than in the case when the detection resistor is not provided. Since the current flowing in the normal direction during the time interval "b" is in the reverse direction with respect to the detection resistor 6b, the voltage induced in the resistor 6b appears as a negative voltage at the terminal 8b.

However, the N gate 5b serves as a diode using VSS as an anode voltage since there is a P-N junction between the drain and P-well when the N gate 5b is in an OFF state. Therefore the negative voltage at the terminal 8b becomes a forward voltage by the N gate 5b which serves as a diode and a forward current flows in the N gate 5b. And since the impedance is low when the forward current flows in the N gate 5b, the rotor oscillation is dampened.

The relation between the operation of the rotor 2 and the detection signal will be illustrated in conjunction with FIG. 5. FIG. 5 shows the relation between the stator 1 and the rotor 2. The stator 1 is provided with inner peripheral notches 16a, 16b to determine the indexing or stepping torque and outer peripheral notches 15a, 15b to enable the stator to be formed in one piece. As shown in the art the stator may be separated at 15a and 15b to form a two-piece stator. Magnetic poles N and S assume positions rotated at about 90° from the inner peripheral notches 16a, 16b under the rest condition of the rotor 2 as shown in FIG. 5(A).

FIG. 5(B) shows the condition when the driving pulse is applied to the rotor, and the rotor rotates in the forward direction as denoted by an arrow mark 17. Since the driving pulse width is no more than 3.9 msec, the pulse is OFF at the time the magnetic poles of the rotor reach in the proximity of the inner peripheral notches. In case a heavy load is connected to the motor, the rotor cannot complete forward rotation and rotates in the reverse direction as shown in FIG. 5(C). In this case the magnetic poles of the rotor pass in the proximity of the outer peripheral notches 15a, 15b and a large current is generated in the coil. However, since the circuit in FIG. 2 is in the state of the closed loop 10 at this moment, the negative voltage is present at the terminal 8b, and the forward current flows in the N gate 5b serving as the diode, and thereby the movement rotor 2 is dampened. Accordingly, the rotor 2 is decelerated rapidly and the voltage induced by the oscillation of the rotor 2 is small thereafter. On the other hand, in case a light load is connected to the motor and the rotor continues to rotate by inertia, the rotor 2 rotates in the forward direction as denoted by an arrow mark 19 as shown in FIG. 5(D). Since the magnetic flux generated by the rotor 2 at this time is in the direction meeting at a right angle with the axis of the outer peripheral notches 15a, 15b, the induced current is small in the beginning. And a large current is generated when the magnetic poles rotate to positions adjacent the outer peripheral notches 15a and 15b.

At this time, since the negative voltage is present at the terminal 8b of the closed loop 10, the rotor is dampened by the diode effect of the N gate 5b. Thereafter the rotor passes by the rest position shown in FIG. 5(A) and the voltage which is able to detect the rotation of the rotor 2 is present at the terminal 8b in FIG. 2 when the rotor restores to its rest position.

Numeral 20 in FIG. 6(A) is the voltage waveform of the terminal 8b when the rotor 2 rotates. The time interval "a" shows the period during which the driving pulse whose pulse width is 3.9 msec is applied.

The circuit which exists in FIG. 2 at the time interval a is the current passage 9 whose VDD=1.57 V. The time interval "b" shows the voltage waveform of the voltage induced by the oscillation of the rotor in the closed loop 10 in FIG. 2. The negative voltage is clamped at about 0.5 V by the diode effect of the N gate 5b and the peak of the positive voltage is 0.4 V. The waveform 21 shows the voltage waveform of the terminal 8b when the rotor 2 does not rotate and the peak of the positive voltage is less than 0.1 V. The rotation and non-rotation of the rotor is judged or detected by distinguishing between the above two peak voltages.

Though the difference between two peak voltages is small, the voltage can be easily amplified by the method mentioned below.

The normally open loops 10 and 11 in FIG. 2 are alternately closed during the time interval "b" in FIG. 6(A).

In the loop 11, since both ends of the coil 3 are shorted by the N gates 4b, 5b having an ON resistance around 100Ω a current generated by the oscillating motion of the rotor is large. However, when the loop 10 is switched on, the current flows through the detection resistor 6b for an instant due to the inductance component of the coil 3. Therefore the high peak voltage is present for an instant across the detection resistor 6b. The voltage waveform 20 at the terminal 8b induced by the rotor 2 is as shown by a voltage waveform in FIG. 6(B) when the normally open loops 10 and 11 in FIG. 2 are alternately closed. FIG. 6(C) shows the voltage waveforms 22 and 23 of FIG. 6B on an enlarged time axis. The peak voltage on this occasion is delayed about 30 μsec from the instant that the loop 10 is closed. The delay of the peak voltage is caused by the capacitance between the drain and source of the N gate 5b. The detection signals are easily amplified several times by the above mentioned method and the rotation and non-rotation of the rotor 2 can be detected much more easily. Though the rotation and non-rotation of the rotor 2 can be detected by the above mentioned method, the detection method has a serious disadvantage. Namely, when the stepping motor is subjected to an external alternating magnetic field, a voltage is induced in the coil 3 by the external magnetic field and the detection resistor mistakenly judges that the rotor rotates even in case the rotor does not rotate. Therefore to prevent the stepping motor from stopping when placed in an alternating magnetic field, the anti magnetic characteristic must be improved so that the pulse width of 3.9 msec can normally drive the stepping motor. The alternating anti magnetic-characteristic is shown by curves in FIG. 7 and is less than 3 oersteds when the pulse width is 3.9 msec.

Therefore, a very close tolerance anti-magnetic structure is required to drive the stepping motor in accordance with the correction driving method in order to reduce the overall size, thickness and cost of the timepiece. However, the advantage of the correction driving method is not fully achieved due to the space requirements and cost for the anti-magnetic structure.

On the other hand, there is another driving method to vary the normal pulse width according to the load in order to further reduce the current consumption in the stepping motor. In this case, the rotor of the stepping motor is driven by a pulse having the minimum pulse width to rotate the rotor in case of a light load such as when the calendar mechanism is not being operated.

Under such conditions of minimum pulse width, the alternating anti-magnetic characteristic deteriorates even more as shown in FIG. 7. Accordingly it is necessary to strengthen the anti magnetic structure such as by using a sealed plate and the like. Therefore the primary object of this driving method which is to reduce the current in the stepping motor in order to thereby reduce the thickness and size of the timepiece is hardly achieved.

SUMMARY OF THE INVENTION

It is an object of the present invention to prevent the deterioration of the alternating anti-magnetic characteristics of a timepiece stepping motor which is driven by the correction driving method and to detect the existence of an external alternating magnetic field by the voltage detection circuit which is used for detecting the rotor rotation. To perform this dual detection, it is necessary to enhance the detection sensitivity of the alternating magnetic field and, according to this invention, the detection sensitivity of the alternating magnetic field is easily enhanced in comparison with the voltage amplification in the case of detecting the rotor rotation only by changing from the switching groups for amplifying the detection signal to other switching groups, and consequently, the stepping motor is driven more stably.

DETAILED DESCRIPTION OF THE PREFERRED EMBODIMENT

Now the present invention will be described in conjunction with two embodiments.

Figure 1A:
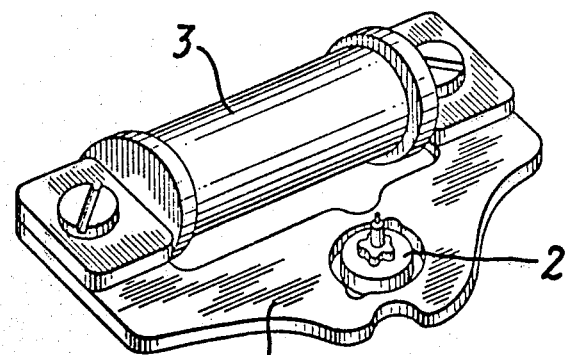
FIG. 1(A) is a perspective view of a stepping motor for the electronic timepiece conventionally used and according to the present invention.
Figure 1B:
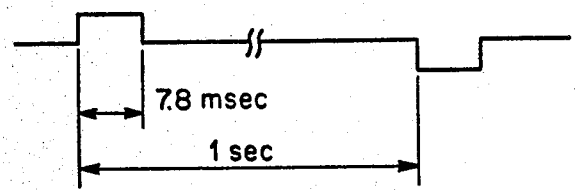
FIG. 1(B) is a waveform chart of the driving pulse of the conventional stepping motor.
Figure 2:
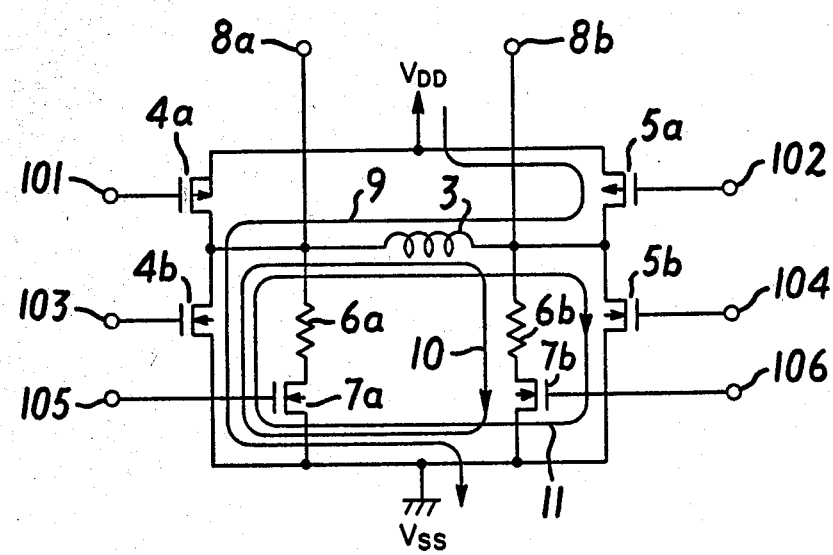
FIG. 2 is a circuit diagram of the driver detection circuit according to the conventional type and the present invention.
Figure 3:
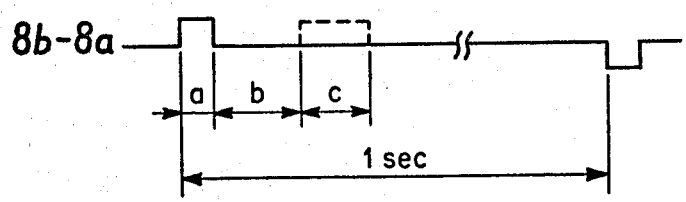
FIG. 3 is a waveform chart of the driving pulse of the conventional correction driving method.
Figure 4:
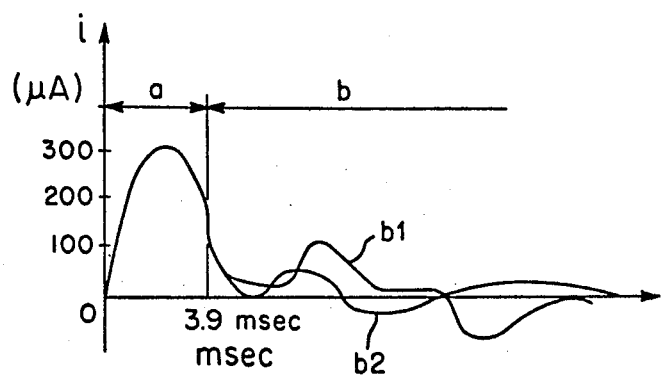
FIG. 4 shows a current waveform of the stepping motor during the driving pulse and after the driving pulse when current is inducted by oscillation of the rotor both in the case of motor rotation and non-rotation.
Figure 5A:
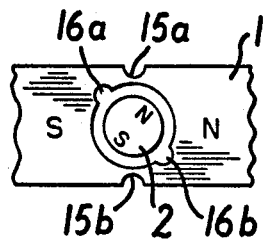
FIG. 5(A) shows a schematic diagram of the stator and the rotor when the rotor rests.
Figure 5B:
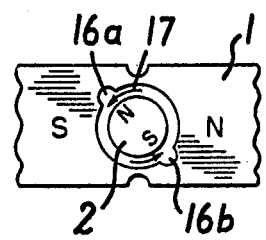
FIG. 5(B) shows the forward rotation direction of the rotor when the driving pulse is applied.
Figure 5C:
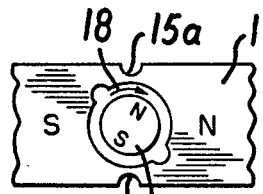
FIG. 5(C) shows the operation of the rotor when the rotor cannot rotate.
Figure 5D:
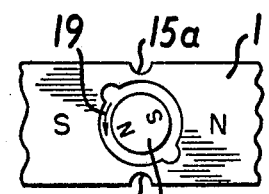
FIG. 5(D) shows the operation of the rotor after the driving pulse is applied when the rotor rotates.
Figure 7:
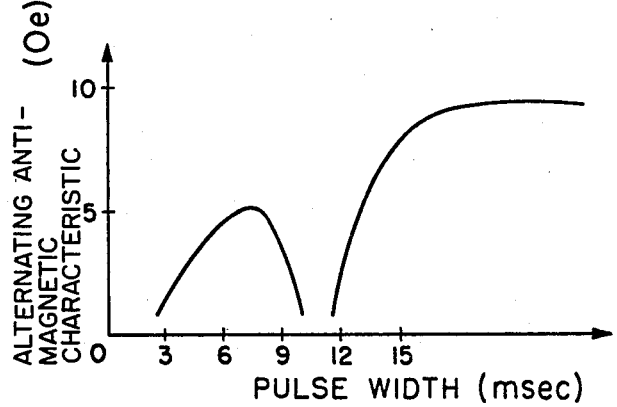
FIG. 7 shows a characteristic diagram of the pulse width and the alternating anti-magnetic characteristic.
Figure 8:
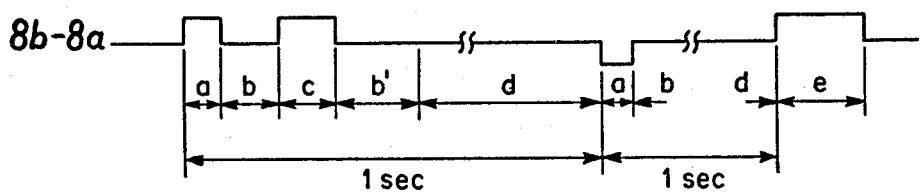
FIG. 8 shows a waveform chart of the driving pulse of the correction driving and magnetic field detection method according to the present invention.
Figure 6A:
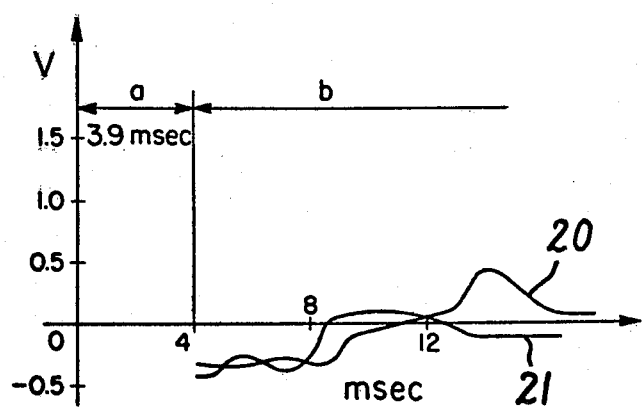
FIG. 6(A) shows voltage waveforms induced in the detection resistor in case the rotor rotates and does not rotate.
Figure 6B:
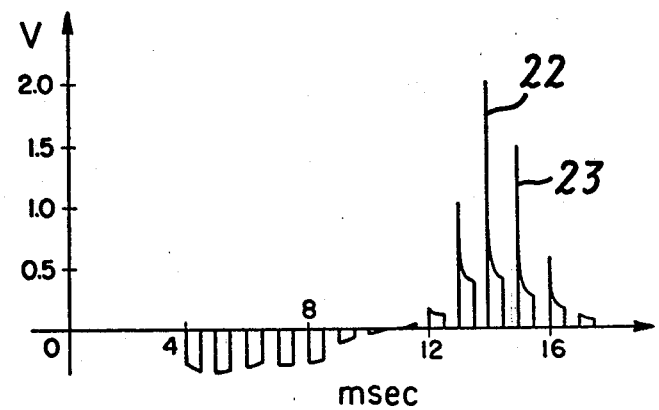
FIG. 6(B) shows voltage waveforms induced in the detection resistor when the loop including the high resistance element and the loop including the low resistance element are closed in case the rotor rotates and does not rotate.
Figure 6C:
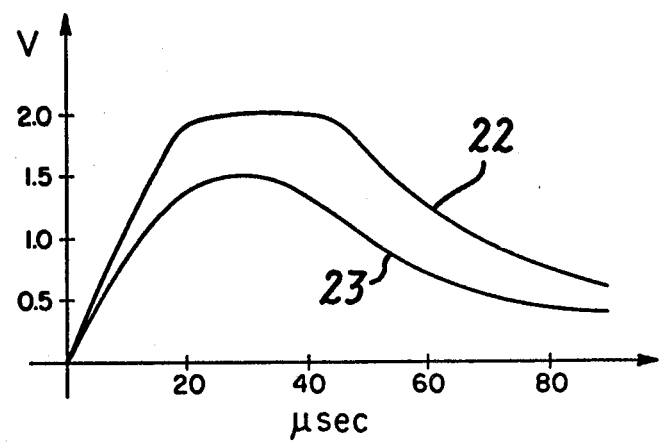
FIG. 6(C) shows an expanded view of the waveforms 22 and 23 in FIG. 6(B)

FIG. 8 shows a time chart showing the signals at the terminals 8a and 8b in FIG. 2, where a is a normal driving pulse, b is a time interval of the rotor during rotating and non-rotating conditions, c is a correction driving pulse for driving the stepping motor again when the rotor is in the non-rotating conditions, b' is a time interval of the rotor from the start condition to the rest condition while being driven by the correction driving pulse, and d is a time interval of the rotor in the rest condition. The existence of the voltage induced in the coil 3 due to the presence of an alternating magnetic field is detected during the time interval d of the rotor rest condition in accordance with this invention. If the voltage is detected, the stepping motor is regarded as being subjected to the alternating magnetic field, and the next normal driving pulse is selected to have a pulse width which improves the alternating anti-magnetic characteristics, and thereby the conventional defects are eliminated. The pulse to improve the alternating anti-magnetic characteristic can be easily selected by the graph in FIG. 7.

Figure 9:
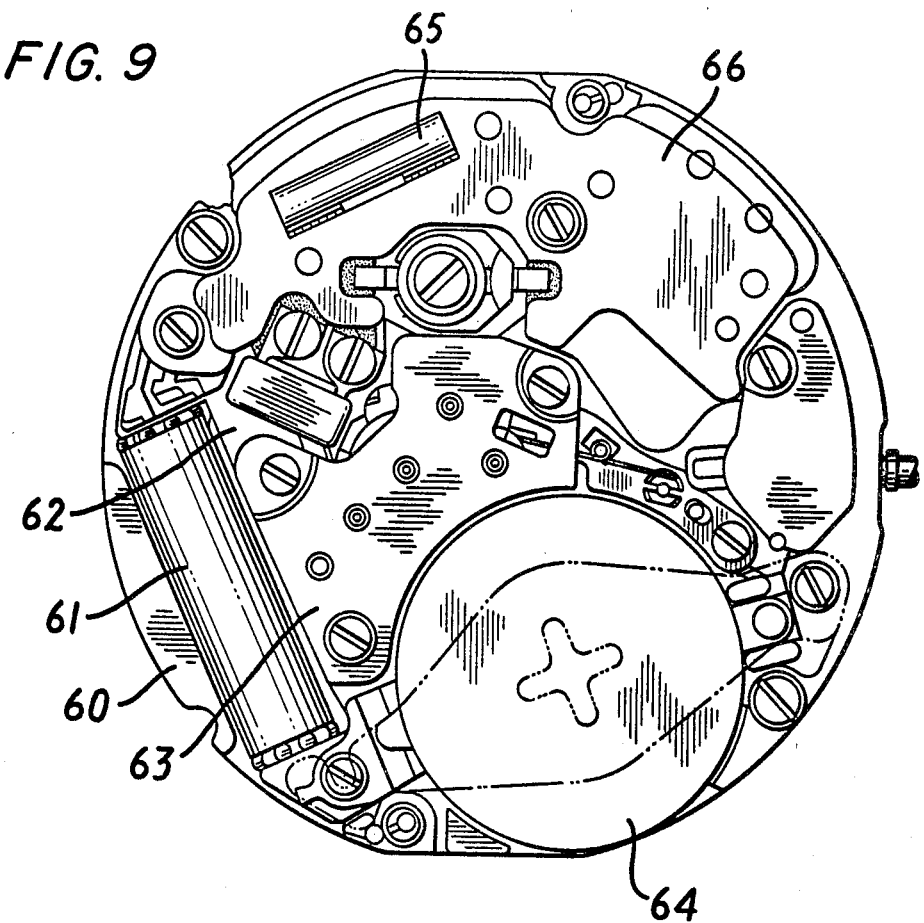
FIG. 9 shows a plan view of an electronic timepiece.

FIG. 9 shows an electronic timepiece according to the present invention, in which reference numeral 60 denotes a base plate having mounted thereon a coil block 61, a stator 62, bridges 63 for supporting a rotor, gear train and the like, a battery 64, a quartz crystal resonator 65, and a circuit block 66 incorporating a circuit according to the present invention and mounting an IC thereon.

Figure 10:
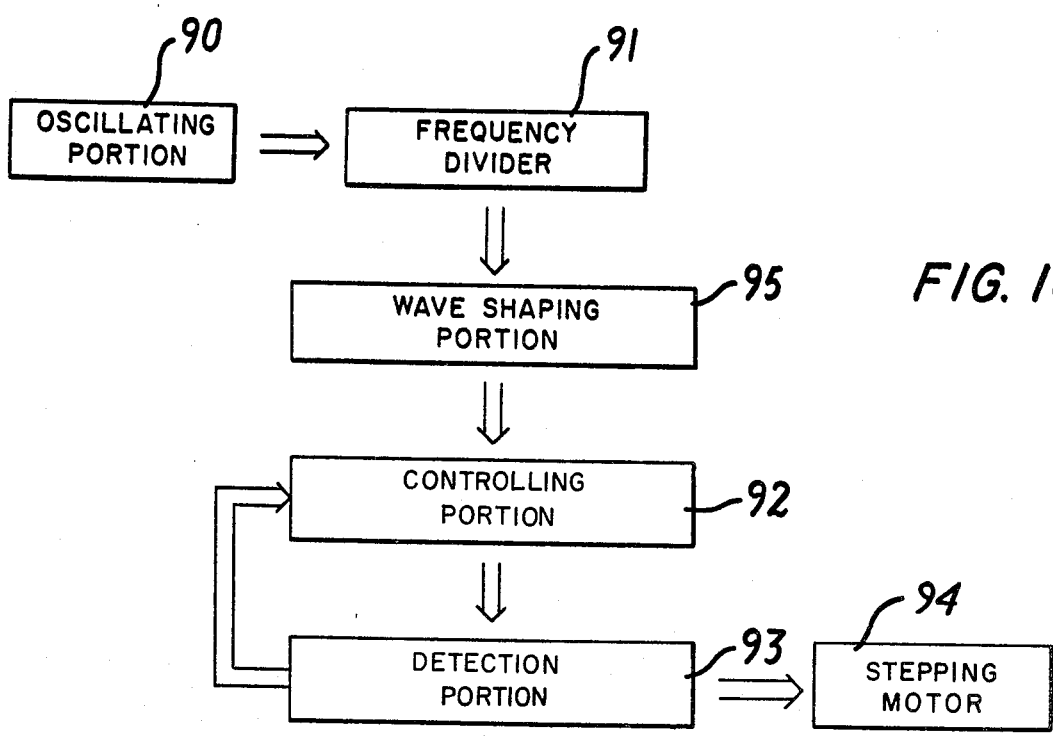
FIG. 10 is a block diagram of an electronic timepiece according to the present invention.

FIG. 10 shows a block diagram of an electronic circuit of an electronic timepiece according to the present invention. Reference numeral 90 denotes an oscillating portion comprised of a quartz crystal resonator which generates a high frequency signal of 32768 Hz. The signal is divided into 1 second signal by a frequency divider 91 which consists of a flipflop circuit of 15 steps. The outputs of each step of the flipflop are composed in a wave shaping portion 95 which forms therefrom the driving pulse for driving the stepping motor and the timing pulse for detection by means of AND gate, OR gate, a flipflop circuit and the like. A driver detection portion 93 is composed of a circuit such as shown in FIG. 2 and of a comparator which judges the detection signal produced at the terminals 8a and 8b. Further the driving output of the stepping motor is connected to a stepping motor 94 and at the same time the detection signal is fed back to a controlling portion 92.

The wave shaping portion 95 composes the signal necessary for the controlling portion by the signal produced from the frequency divider. The driver detection portion 93 will be illustrated first since it is common to the embodiments (1) and (2) illustrated later.

Figure 11A:
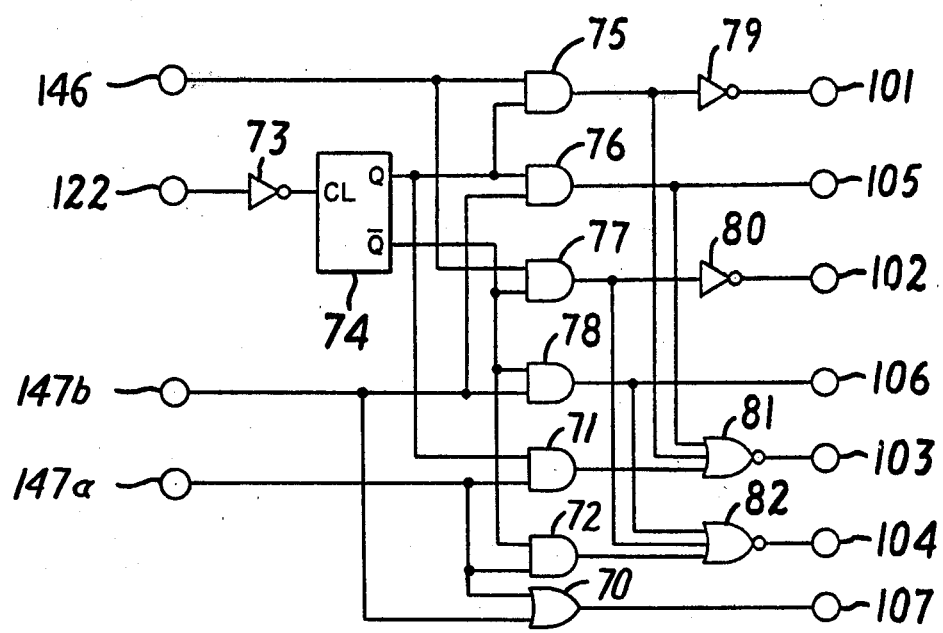
FIG. 11(A) is a circuit diagram of a part of the driver detection portion circuitry.

FIG. 11(A) shows a part of the driver circuit in the driver detection portion.

Figure 11B:
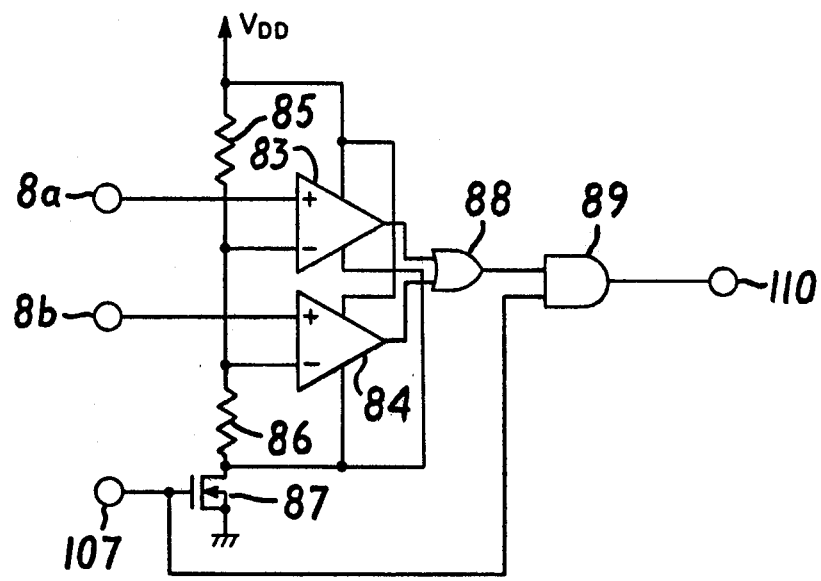
FIG. 11(B) is a circuit diagram of a comparator of the driver detection portion.
Figure 12A:
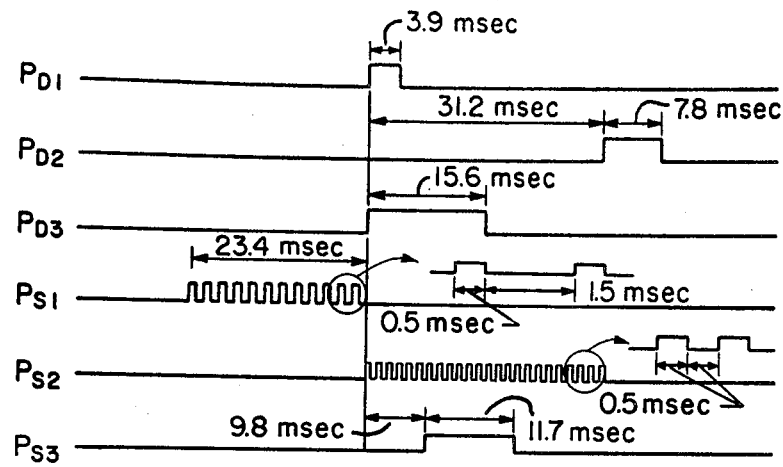
FIG. 12(A) shows a time chart of the outputs of one embodiment of the wave shaping portion.
Figure 15A:
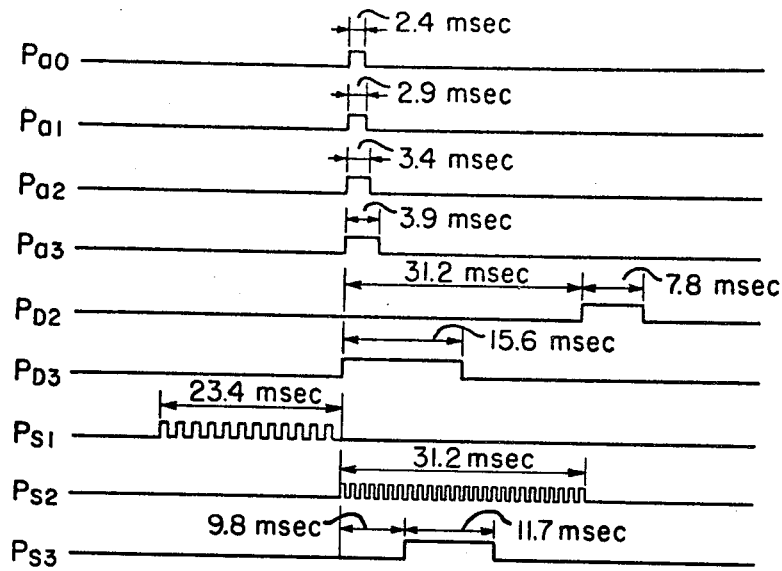
FIG. 15(A) is a time chart showing the outputs of another embodiment of the wave shaping portion.

Output terminals 101, 102, 103, 104, 105 and 106 in FIG. 11(A) are connected to input terminals of the same numerals in FIG. 2 respectively and the terminal 107 is connected to the terminal 107 in FIG. 11(B). Input terminals 147a and 147b in FIG. 11(A) control the circuit which will form the closed loop 10 in FIG. 2 at "H" (High level) and a terminal 122 changes the condition of a flipflop (referred to as FF hereafter) 74 which controls the current direction in the stepping motor. The terminal 122 changes the condition of FF74 by the positive edge input when the PD$_3$ signal in FIGS. 12(A) and 15(A) is applied thereto.

Now the circuit in FIG. 11(A) will be illustrated in detail. The FF74 is a negative edge trigger type and the condition of FF74 is inverted when the signal PD$_3$ produced from the terminal 122 is fed to the CL terminal of FF74 via an inverter (referred to as NOT hereafter) 73. An output Q produced from FF74 is fed to AND gates (referred to as AND hereafter) 75, 76 and 71, and an output Q̄ produced from FF74 is fed to ANDs 77, 78 and 72. A terminal 146 is connected to ANDs 75 and 77. A terminal 147a is connected to ANDs 71, 72 and OR gate (referred to as OR hereafter) 70. A terminal 147b is connected to ANDs 76, 78 and OR 70. The output from AND 75 is connected to the terminal 101 and NOR gate (referred to as NOR hereafter) 81 via NOT 79. The output from AND 76 is connected to the terminal 105 and NOR 81. The output from AND 77 is connected to the terminal 102 and NOR 82 via NOT 80. The output from AND 78 is connected to the terminal 106 and OR 82. The output from AND 71 is fed to NOR 81 and the output from NOR 81 is connected to the terminal 103. The output from AND 72 is fed to NOR 82 and the output from NOR 82 is connected to the terminal 104. The output from OR 70 is connected to the terminal 107.

FIG. 11(B) is a voltage detecting portion which comprises a part of the driver detection portion 93. The terminals 8a and 8b of the circuitry in FIG. 2 are respectively connected to the terminals 8a and 8b in FIG. 11(B). The terminal 107 in FIG. 11(A) is connected to the terminal 107 in FIG. 11(B).

A pair of resistors 85, 86 divides the supply voltage and the divided voltages serve as the reference signal for detecting rotation and non-rotation of the rotor and for detecting the external magnetic field. The N gate 87 prevents the current from flowing in the reference voltage dividing resistors 85 and 86 other than during the detection period. Reference numerals 83, 84 denote comparators and the outputs from the comparators are at "H" level when the voltage of the positive input is higher than the voltage of the negative input. The outputs from the comparators 83, 84 are fed to OR 88 and the output therefrom is fed to AND 89 together with the signal from the terminal 107 and the detection output signal is fed to a terminal 110.

EMBODIMENT 1

FIG. 12(A) shows the output waveforms of the wave shaping portion 95 shown in FIG. 10 according to one embodiment. The outputs from the wave shaping portion 95 are fed to the input terminals of the controlling portion 92 in FIG. 12B. The waveforms in FIG. 12(A) are formed of signals fed from the frequency divider and composed by AND, OR, NOR, NAND, NOT gates and the like. PD$_1$ is a normal driving pulse having a pulse width of 3.9 msec and is produced every one second. PD$_2$ is a connection during pulse having a pulse width of 7.8 msec. PD$_3$ is an pulse having anti-magnetic driving pulse width of 15.6 msec for improving the anti-magnetic characteristics when an external alternating magnetic field is detected. PS$_3$ is a timing pulse signal for determining the time during which rotation of the rotor is detected. PS$_1$ is a pulse to detect the alternating magnetic field and to amplify the rotation detection signal and has a pulse width of "H"=0.5 msec and "L"=1.5 msec, i.e., H:L=1:3. The PS$_1$ signal is produced 23.4 msec before the PD$_1$ pulse rise timing. PS$_2$ is a pulse for detecting motor rotation and has a pulse width of "H"=0.5 msec and "L"=0.5 msec, i.e., H:L=1:1 and is produced 31.2 msec after the PD$_1$ rise timing. The different pulse widths correspond to different effective powers. The rotation detection signal of the rotor is to be amplified by the pulse of H:L=1:1, actually however, the rotation of the rotor is detected only at an interval in which PS$_3$ is "H", i.e., for 11.7 msec.

Figure 12B:
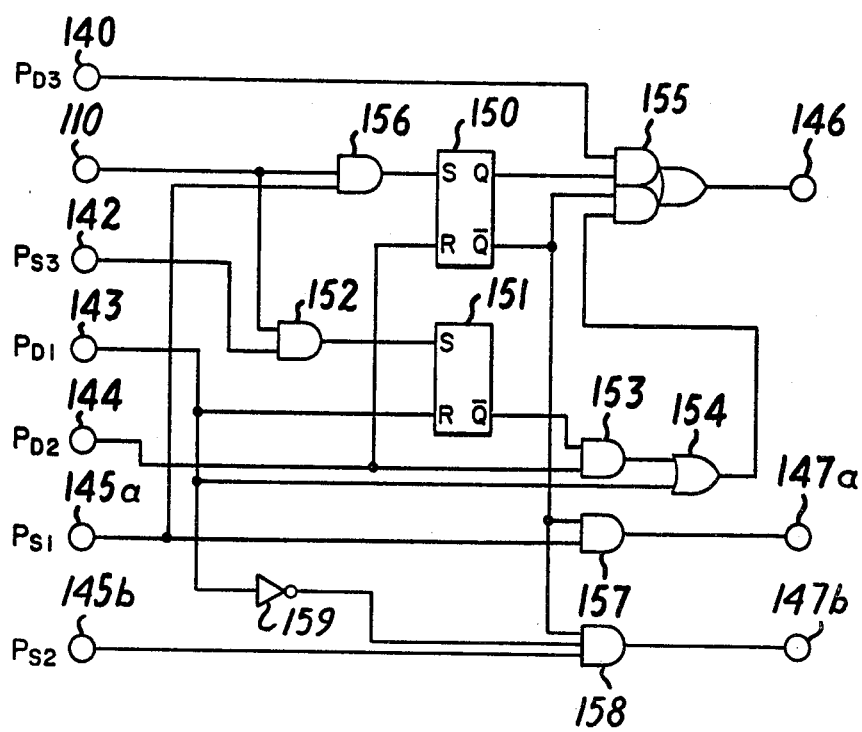
FIG. 12(B) is a circuit diagram showing one embodiment of the controlling portion circuitry which receives the signals in FIG. 12(A)

Referring now to FIG. 12(B), a detection signal from the terminal 110 is fed to the S input of SR-FF 150 via AND 156. The PS$_3$ signal from a terminal 142 is fed to an input of AND 152 and an output of AND 152 is connected to the S input of SR-FF 151. The PD$_1$ signal from a terminal 143 is connected to the R input of SR-FF 151, OR 154 and AND 158 via NOT 159. An output Q$_1$ of SR-FF 151 is connected to AND 153 and an output from AND 153 is fed to OR 154 and an output from OR 154 is fed to AND-OR circuitry 155. Outputs Q and Q̄ of SR-FF 150 are connected to AND-OR circuitry 155 and an output from AND-OR circuitry 155 is connected to a driving pulse output terminal 146. An output Q̄ of SR-FF 150 is fed to ANDs 157 and 158. A terminal 144 is connected to R input of FF 150 and AND 153. A terminal 145a is connected to AND 156 and a terminal 147a via AND 157, and a terminal 145b is connected to a terminal 147b via AND 158.

Since the external alternating magnetic field does not exist in case of the normal operation (i.e., the magnetic field strength is below the threshold level of detection), the input to the terminal 110, i.e., the output from the alternating magnetic field detection circuit, is not produced, so that the SR-FF 150 is not set. Accordingly the normal driving pulse PD$_1$ of 3.9 msec is fed to the terminal 146 via OR 154. And when a rotation signal signifying rotation of the rotor is fed to the terminal 110, SR-FF 151 is set, and the PD$_2$ pulse of 7.8 msec pulse width is not produced at the terminal 146 since Q̄ output of FF 151 is "L". But when the rotor does not rotate, the terminal 110 does not receive the rotation signal, and SR-FF 151 is not set, and Q̄="H". Therefore, the PD$_2$ correction driving pulse of 7.8 msec pulse width is fed to the terminal 146 via AND 153, OR 154 and AND-OR 155.

When the timepiece is subjected to an alternating magnetic field above a predetermined strength, a magnetic field detection signal is fed to the terminal 110, SR-FF 150 is set, Q="H", and the anti-magnetic driving pulse PD$_3$ and of 15.6 msec pulse width is fed from the terminal 140 to the terminal 146 via AND-OR circuitry 155. Since the signal from the terminal 146 is fed to the input terminal 146 of the driving circuit in FIG. 11(A) and the signal from the terminal 147a is fed to the terminal 147a of the driving circuit in FIG. 11(A), the stepping motor is driven compulsorily by the anti-magnetic driving pulse of 15.6 msec. The signal from the terminal 147b is fed to the terminal 147b in FIG. 11(A).

EMBODIMENT 2

In the correction driving method illustrated in Embodiment 1, the pulse width of the normal driving pulse is fixed.

On the contrary, in order to reduce the power consumption of the stepping motor than the method in Embodiment 1, the stepping motor can be driven by driving pulses having the minimum pulse width needed to be able to rotate the stepping motor under different load conditions.

Figure 13:
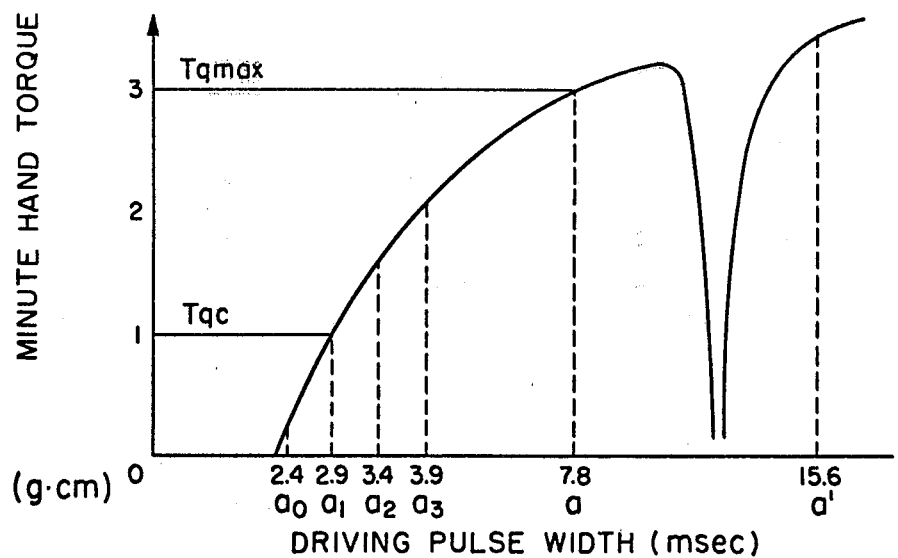
FIG. 13 is a characteristic diagram showing the relation between the driving pulse width and the minute hand torque.

FIG. 13 shows the relation between the driving pulse width and the torque of the stepping motor used in the electronic timepiece in the present embodiment.

In case of the fixed pulse driving, the driving pulse width is settled at a point "a" in order to assure the maximum torque Tq max of the stepping motor under worst case load conditions.

In the correction driving method described with reference to embodiment (1), the pulse width of the normal driving pulse is selected at $a_2=3.4$ msec or $a_3=3.9$ msec if $T_{qc}$ represents the torque required for operation of the calendar mechanism. In case the rotor cannot complete its rotation by the normal driving pulse, the correction pulse is further added, therefore, if the correction pulse is used too often, the current consumptions of both the normal driving pulse and the correction pulse are added as a result there is a possiblity that the current consumption increases instead of decreases. Actually, however, the rotor rotates even by the pulse width of $a_0=2.4$ msec in case no load is connected. Therefore the current consumption of the stepping motor can be reduced even more if the stepping motor can be driven by the driving pulse having the pulse width of $a_0=2.4$ msec.

Figure 14:
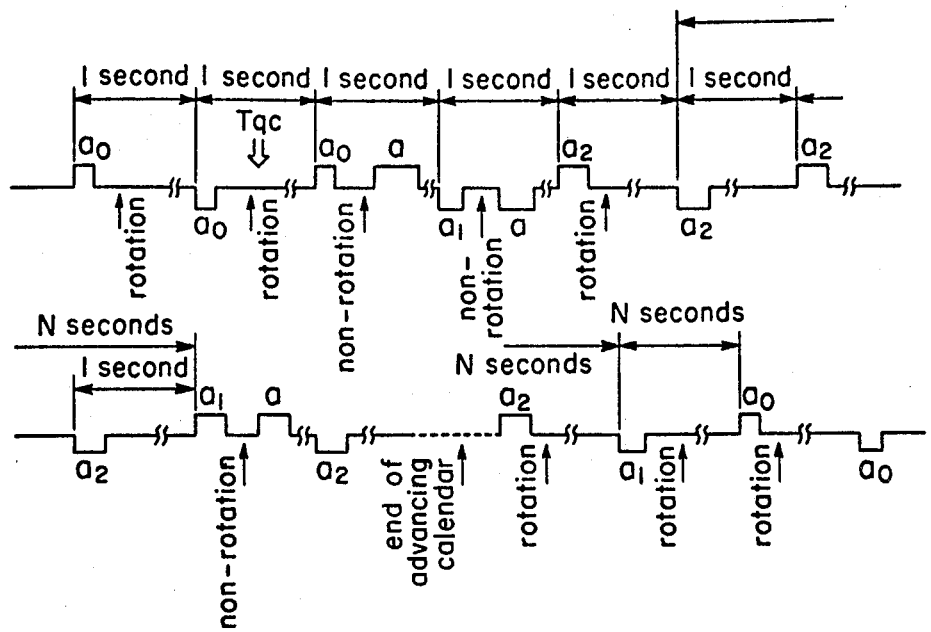
FIG. 14 is a waveform chart of the driving pulses showing the relation between the correction driving method which varies the driving pulse width according to the load variation and the detection of the alternating magnetic field in accordance with the present invention.

The embodiment (1) aims to reduce the current consumption. The operation of the stepping motor will be illustrated in conjunction with FIG. 14.

Figure 15B:
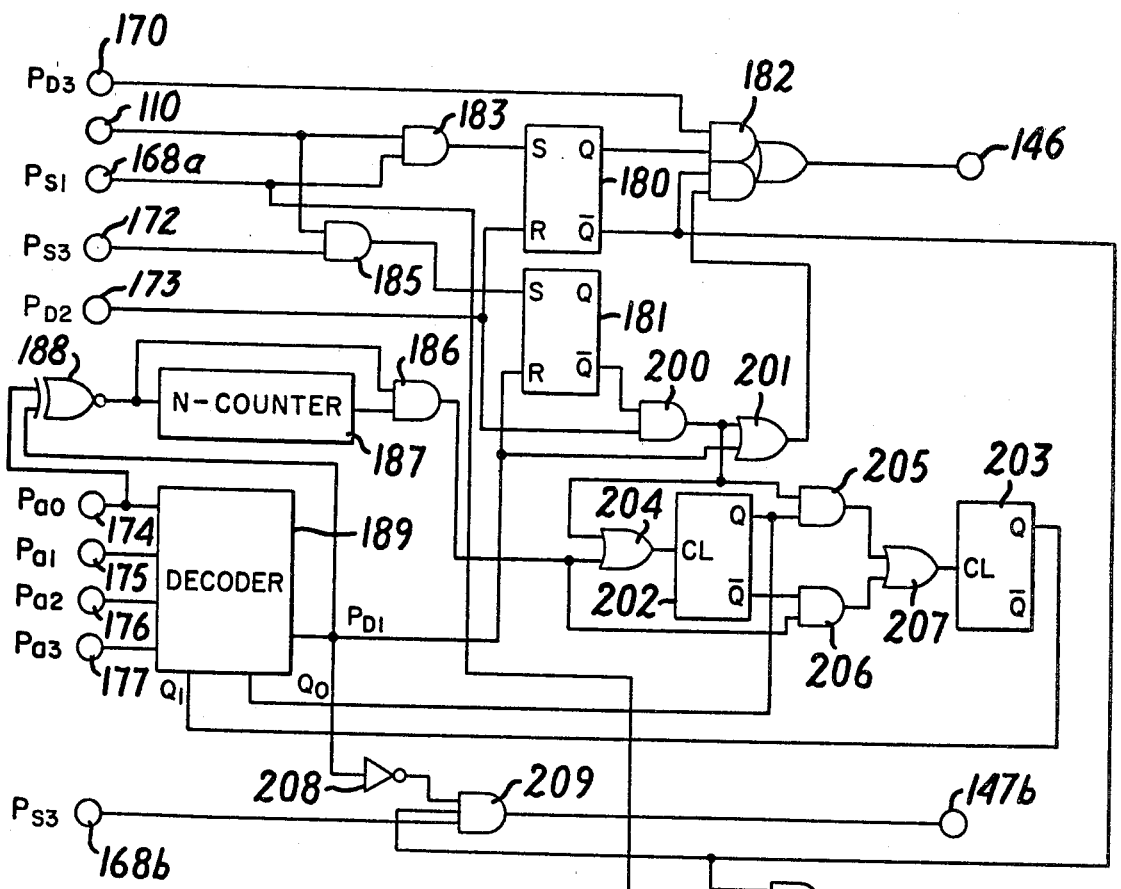
FIG. 15(B) is a circuit diagram showing another embodiment of the controlling portion circuitry which receives the signals in FIG. 15(A).

The stepping motor is normally driven by the pulse having the pulse width of $a_0=2.4$ msec and in case the rotor cannot complete rotation by the pulse width $a_0$ due to, for example the calendar load, the detection circuit detects that the rotor does not rotate and the rotor is driven by the correction driving pulse. The pulse width of the correction driving pulse is a $=7.8$ msec in FIG. 15 generally. The driving pulse width after 1 second is then automatically settled at $a_1=2.9$ msec, the width a little longer than $a_0=2.4$ msec, as both the normal driving pulse and the connection driving pulse were applied to the stepping motor. In the embodiment in FIG. 13, however, the rotor does not rotate since the pulse width does not reach that needed for the calendar torque Tqc even when the pulse width $a_1=2.9$ msec, then the stepping motor is driven by the correction driving pulse of $a=7.8$ msec. Then the pulse width of the normal driving pulse after 1 second is automatically set at $a_2=3.4$ msec. Since the output torque on this occasion is larger than the calendar torque Tqc, the stepping motor is driven by the pulse having the pulse width of $a_2=3.4$ msec each second. However, in case the stepping motor is driven by the pulse having the pulse width of $a_2=3.4$ msec even if no calendar load is present such is disadvantageous to reduce the power consumption. In order to solve the above mentioned disadvantage, a circuit to shorten the driving pulse width each N second is added. As a result the stepping motor is driven in such manner that the driving pulses of $a_2=3.4$ msec are continuously produced for N times, then the pulses of $a_1=2.9$ msec are continuously produced, and then the pulses of $a_0$ are continuously produced. By this driving method the conventional stepping motor can be driven with less power.

FIG. 15(A) shows an example of the controlling portion 92 designed on the basis of the stepping motor having the characteristics shown in FIG. 13. Waveforms of the time chart shown in FIG. 15 (a) are produced from the wave shaping circuit 95 shown in FIG. 10. The wave shaping circuit 95 which receives the signals produced from the frequency divider 91 is composed of a suitable combination of gate circuits.

The time chart shown in FIG. 15(A) will now be described.

One of the normal driving pulses having the pulse widths respectively $Pa_0=2.4$ msec, $Pa_1=2.9$ msec, $Pa_2=3.4$ msec and $Pa_3=3.9$ msec is automatically selected in accordance with the load connected to the stepping motor. The different pulse widths correspond to different effective powers. The selected pulse is the normal driving pulse PD1. PD2 is the correction driving pulse to drive the stepping motor in case the stepping motor is not rotated by PD1 and assures the maximum torque when the pulse width is 7.8 msec. PD3 is the anti-magnetic driving pulse and has a pulse width of 15.6 msec, which is the most effective pulse width when the detection circuit judges that the timepiece is subjected to the influence of an external magnetic field.

$PS_1$ is an input pulse for detecting the alternating magnetic field and has a pulse width of "L"=0.5 msec and "H"=1.5 msec, i.e., the duty cycle of 1:3. $PS_2$ is a pulse for detecting the rotor rotation and has a pulse width of "L"=0.5 msec and "H"=0.5 msec, i.e., the duty cycle of 1:1. $PS_3$ is a timing pulse to fix the time to detect rotation and non-rotation of the rotor. $PS_2$ starts detecting after 9.8 msec since the normal driving pulse $PD_1$ is applied and pulse width of $PS_3$ is 11.7 msec.

The outputs from the wave shaping circuit 95 mentioned above are connected to terminals in FIG. 15(B).

The pulse signals $Pa_0$, $Pa_1$, $Pa_2$, $PD_2$, $PD_3$, $PS_1$, $PS_2$ and $PS_3$ are respectively applied to terminals 174, 175, 176, 177, 173, 170, 168a, 168b and 172. A detection output from the detection portion is fed to a terminal 110. The terminal 146 is connected to the terminal 146 of the driver detection portion in FIG. 11(A). The terminals 147a and 147b are respectively connected to the terminals 147a and 147b in FIG. 11(A).

The composition and operation of the terminals 170, 110, 172, 173, AND 183, NOT 208, AND 185, SR-FFs 180 and 181, AND-OR circuitry 182, ANDs 200, 201, 209 and 211 are not illustrated since it is completely the same as FIG. 12(B). OR 204, ANDs 205, 206, OR 207, FFs 202 and 203 comprises up-down counters of 2 bits. An input from AND 200 is an up count input and an input from AND 186 is a down count input. The counter outputs from the up-down counters are the outputs $Q_0$, $Q_1$ from FFs 202 and 203. The outputs from the up-down counters are connected to a decoder 189 whose output comprises the normal driving pulse $P_1$ composed as shown in Table 1.

TABLE 1

| $Q_1$ | $Q_0$ | $PD_1$ |
|---|---|---|
| 0 | 0 | $Pa_0$ = 2.4msec |
| 0 | 1 | $Pa_1$ = 2.9msec |
| 1 | 0 | $Pa_2$ = 3.4msec |
| 1 | 1 | $Pa_3$ = 3.9msec |

The normal driving pulse $PD_1$ produced from the decoder 189 is the same as the normal driving pulse $PD_1$ illustrated in FIG. 12(B) and fed to OR 201 and RS-FF 181. The normal driving pulse $PD_1$ is fed to AND 209 via NOT 208 in order to prevent the detection signal from feeding into the decoder 189 when the stepping motor is driven by the normal driving pulse $PD_1$. Therefore the output pulse signal $PS_1$ does not appear at the terminal 147 when the normal driving pulse is applied. The normal driving pulse $Pa_0$ having the pulse width 2.4 msec (the pulse having the least effective power) and the normal driving pulse $PD_1$ are fed to an exclusive NOR 188. Therefore an input to N-counter 187 is prohibited when $PD_1=Pa_0$ and N-counter 187 counts each second when $PD_1 \neq Pa_0$. When N-counter 187 finishes counting N, the output of N-counter 187 changes to the high level and a signal synchronized with $PD_1$ is fed to OR 204, and thereby the up-down counter decrements or counts down.

When the rotor does not rotate, the correction driving pulse $PD_2$ is fed to AND 200 and the up-down counter counts up. Therefore the pulse width of $PD_1$ varies in a manner that $Pa_0 \rightarrow Pa_1$, $Pa_1 \rightarrow Pa_2$, and $Pa_2 \rightarrow Pa_3$.

In the above mentioned embodiments, the closed loops after applying the driving pulse are switched in order to amplify the detection signal for detecting rotation and non-rotation of the rotor 2 and to amplify the voltage induced in the coil by the external alternating magnetic field. Therefore, it is necessary to detect the alternating magnetic field at the anti-magnetic characteristic level of the normal driving pulse $PD_1$. Accordingly it is necessary to enhance the detection sensitivity of the external alternating magnetic field.

In order to enhance the sensitivity for detecting the alternating magnetic field in comparison with the sensitivity for detecting the rotor rotation, the detection signal of the external magnetic field is amplified by switching the open circuit to the closed loop 11 in FIG. 2 when the magnetic field is detected according to this invention.

When the magnetic field is detected, the voltage develops in the coil under the influence of the external magnetic field, and the current flows in the closed loop 11 in FIG. 2. Then, if N gate 5b in FIG. 2 is OFF, both ends of the coil are open. On this occasion, since the current in the coil becomes zero in an instant, an infinite voltage tends to develop at the terminal 8b in an instant.

Actually, however, since there is a parasitic capacity between the source and drain even if N gate 5b is in an OFF state, the electric charge charges the parasitic capacity, and the voltage does not become infinite but becomes a peak voltage in proportion on the voltage developed in the coil. The detection signal of the rotor rotation is also amplified by the similar principle. However, since the detection signal is amplified by switching from the closed loop 10 to the closed loop 11 in FIG. 2 in this invention, the detection resistor 6b having a finite resistance value is inserted into the closed loop 10, and the current variation in case the current switches from one loop to another is not as large as the current variation in the case when the magnetic field is detected. Thus the amplification of the detection signal is small. Therefore the value of the detection resistor is set in order that the rotation detection signal of the rotor has an appropriate amplification. The rotating condition and non-rotating condition of the rotor is determined by comparing the voltage developed at the detection resistor and the reference voltage. Although the strength of the external alternating magnetic field is likewise determined with reference to the reference voltage, since the amplification is greater for detecting the magnetic field than the amplification for detecting the rotor rotation, a relatively low strength alternating magnetic field can be detected.

Accordingly, the stepping motor can be driven with the driving pulse having sufficiently long pulse width immediately after the stepping motor is subjected to the magnetic field when the stepping motor is driven by the driving method which body influences on the alternating anti magnetic characteristics as illustrated in embodiment (2). And the effect is great.

Further, since the only element needed to enhance the sensitivity for detecting the magnetic field is the gate element, it is not other necessary to add elements, such as a resistor and voltage detector which would occupy some space within the IC.

Consequently, the stepping motor according to the present invention is driven in such manner to be less affected by external alternating magnetic fields than when driven by the conventional correction driving method. Accordingly the sealed plate usually necessary in the conventional correction driving method to make more effective anti-magnetic sealed structure is not necessary, so the manufacturing cost is reduced.

Further, since the number of parts are reduced and the battery size can be reduced by reduction in overall current consumption on a large scale, the present invention is advantageous to reduce the thickness and size of the electronic timepiece.

What is claimed is:

1. In an electronic timepiece having a stepping motor comprised of a stator, rotor and coil; means for generating and applying driving pulses to the coil to effect stepwise rotation of the rotor; magnetic field detecting means operable when enabled for detecting the presence of an external alternating magnetic field, said magnetic field detecting means comprising a first loop comprised of a first impedance element and said coil; rotation detecting means operable when enabled for detecting rotation and non-rotation of the rotor, said rotation detecting means comprising said first loop and a second loop comprised of a second impedance element and said coil; and circuit means for enabling said magnetic field detecting means by switching said coil from an open-circuit condition to said first loop and for enabling said rotation detecting means by alternately switching between said first and second loops.

2. An electronic timepiece according to claim 1; wherein said circuit means includes means for alternately enabling said magnetic field detecting means and said rotation detecting means so that each operates during a time period different than the other.

3. An electronic timepiece according to claim 1; wherein said first impedance element in said first loop has a lower impedance value than said second impedance element in said second loop.

4. An electronic timepiece according to claim 1; wherein said circuit means includes first switching means connected in said first loop for switching said coil from an open-circuit condition in which both ends of the coil are open-circuited to said first loop, and second switching means connected in said second loop and coacting with said first switching means for alternately switching said coil between said first and second loops.

5. An electronic timepiece according to claim 4; wherein said circuit means further includes means for alternately enabling said magnetic field detecting means and said rotation detecting means so that each operates during a time period different than the other.

6. An electronic timepiece according to claim 4; wherein said means for generating and applying driving pulses comprises means for generating at least three kinds of driving pulses each having different effective powers and each effective when applied to the coil to rotationally drive the rotor under different operating conditions, and control means for selecting one kind of driving pulse for application to the coil in response to detection of rotation of the rotor and a second kind of driving pulse for application to the coil in response to detection of non-rotation of the rotor by said rotation detecting means and for selecting a third kind of driving pulse for application to the coil in response to detection of an external alternating magnetic field by said magnetic field detecting means.

7. An electronic timepiece according to claim 6; wherein said second kind of driving pulse has a greater effective power than said one kind of driving pulse, and said third kind of driving pulse has a greater effective power than said second kind of driving pulse.

8. An electronic timepiece according to claim 7; wherein said second kind of driving pulse has a greater pulse width than said one kind of driving pulse, and said third kind of driving pulse has a greater pulse width than said second kind of driving pulse.

9. An electronic timepiece according to claim 6; wherein said circuit means includes means for enabling said magnetic field detecting means immediately before the application of a driving pulse to the coil and for enabling said rotation detecting means after the application of a driving pulse to the coil.

10. An electronic timepiece according to claim 4; wherein said means for generating and applying driving pulses comprises means for generating at least one kind of normal driving pulses, correction driving pulses having greater effective power than any of said normal driving pulses, and anti-magnetic driving pulses having greater effective power than said correction driving pulses, means for normally applying one of the normal driving pulses to the driving coil in successive predetermined time periods to effect rotation of the rotor, and control means responsive to the detection of non-rotation of the rotor by said rotation detecting means for effecting the application of a correction driving pulse to the driving coil within the same predetermined time period in which the non-rotation was detected to thereby effect rotor rotation and responsive to the detection of an external alternating magnetic field by said magnetic field detecting means for effecting the application of an anti-magnetic driving pulse to the driving coil within the same predetermined time period in which the external alternating magnetic field was detected to thereby effect rotor rotation.

11. An electronic timepiece according to claim 10; wherein said anti-magnetic driving pulses have a longer pulse width than said correction driving pulses.

12. An electronic timepiece according to claim 10; further including means for inhibiting said rotation detecting means in response to the detection of an external alternating magnetic field by said magnetic field detecting means.

* * * * *